(12) United States Patent
Cheng et al.

(10) Patent No.: US 11,099,437 B2
(45) Date of Patent: Aug. 24, 2021

(54) DISPLAY PANEL, METHOD FOR MANUFACTURING SAME, AND DISPLAY DEVICE

(71) Applicant: BOE TECHNOLOGY GROUP CO., LTD., Beijing (CN)

(72) Inventors: Hongfei Cheng, Beijing (CN); Pan Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 52 days.

(21) Appl. No.: 16/339,701

(22) PCT Filed: Apr. 28, 2018

(86) PCT No.: PCT/CN2018/085028
§ 371 (c)(1),
(2) Date: Apr. 4, 2019

(87) PCT Pub. No.: WO2019/033791
PCT Pub. Date: Feb. 21, 2019

(65) Prior Publication Data
US 2020/0174300 A1     Jun. 4, 2020

(30) Foreign Application Priority Data
Aug. 16, 2017   (CN) .......................... 201710703280.6

(51) Int. Cl.
*H01L 27/12* (2006.01)
*G02F 1/1339* (2006.01)
*G02F 1/1362* (2006.01)

(52) U.S. Cl.
CPC .... *G02F 1/13394* (2013.01); *G02F 1/136286* (2013.01); *H01L 27/124* (2013.01); *H01L 27/1288* (2013.01); *G02F 1/136295* (2021.01)

(58) Field of Classification Search
CPC ............... H01L 27/124; H01L 27/1248; H01L 27/1218; H01L 27/1288; H01L 27/1222;
(Continued)

(56) References Cited

U.S. PATENT DOCUMENTS

2006/0281211 A1    12/2006  Yoon et al.
2008/0123007 A1*   5/2008  Cui ..................... G02F 1/13394
                                                             349/43
(Continued)

FOREIGN PATENT DOCUMENTS

CN    104238201 A    12/2014
CN    104503153 A     4/2015
(Continued)

OTHER PUBLICATIONS

International Search Report and Written Opinion dated Aug. 2, 2018, from application No. PCT/CN2018/085028.
(Continued)

*Primary Examiner* — Joseph M Galvin, III
(74) *Attorney, Agent, or Firm* — Thomas | Horstemeyer, LLP

(57) ABSTRACT

The present disclosure provides a display panel, a manufacturing method thereof, and a display device. The display panel includes an array substrate which includes a plurality of pixel regions defined by a plurality of gate lines intersected with a plurality of data lines. Each of the pixel regions includes an aperture region, a non-aperture region surrounding the aperture region, and a spacer disposed in the non-aperture region. Each of the pixel regions includes a padding structure provided in the non-aperture region. The padding structure includes a first pad and a second pad located in the non-aperture region. The first pad and the second pad are located at two sides of the spacer, respectively. The first pad and the second pad are located at two sides of the gate line,
(Continued)

respectively. The padding structure is configured to prevent the spacer from moving into the aperture region.

10 Claims, 6 Drawing Sheets

(58) Field of Classification Search
CPC ............. H01L 27/1225; H01L 27/1255; H01L 27/1266; H01L 27/13; H01L 29/78666; H01L 29/7869
See application file for complete search history.

(56) References Cited

U.S. PATENT DOCUMENTS

| | | | |
|---|---|---|---|
| 2008/0266498 | A1 | 10/2008 | Kim et al. |
| 2017/0153480 | A1* | 6/2017 | Lv .................... G02F 1/133512 |
| 2017/0199410 | A1 | 7/2017 | Jiang et al. |

FOREIGN PATENT DOCUMENTS

| | | | |
|---|---|---|---|
| CN | 105093708 A | | 11/2015 |
| CN | 106226959 A | | 12/2016 |
| CN | 106353930 A | * | 1/2017 |
| CN | 106353930 A | | 1/2017 |
| CN | 107272271 A | | 10/2017 |

OTHER PUBLICATIONS

Extended European Search Report for EP Patent Application No. 18846834.2 dated Mar. 15, 2021.

* cited by examiner

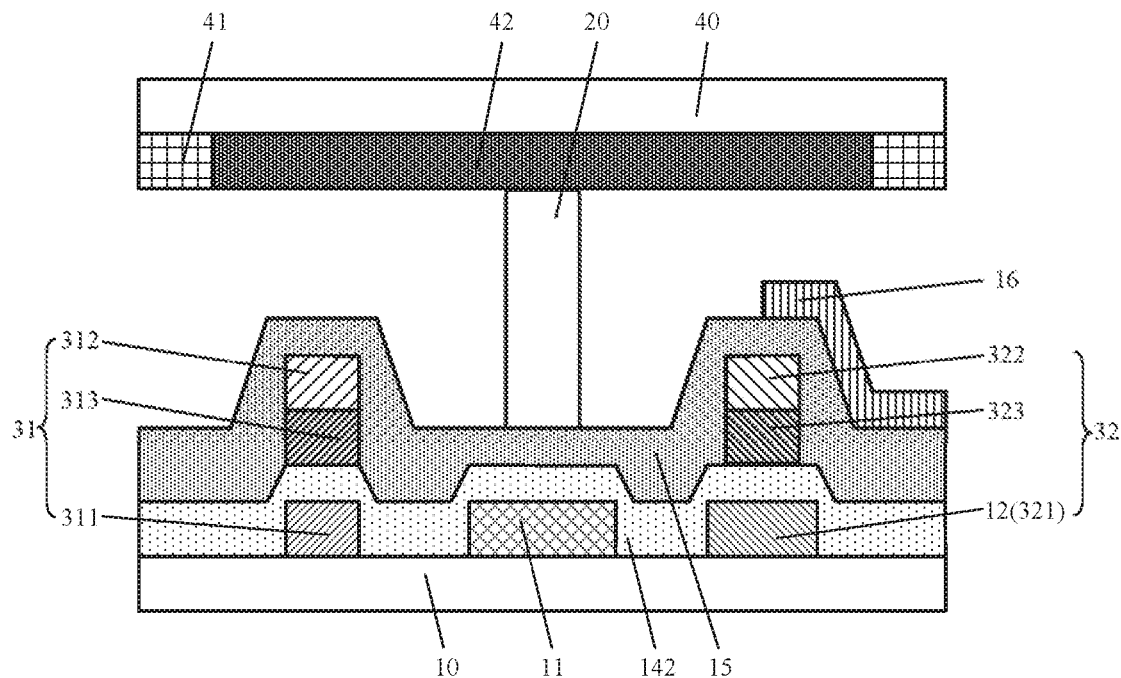
Fig.5
```
                                                    ┌─ S100
Forming a padding structure in a non-aperture region of the
 display panel, the padding structure being located near a
 spacer disposed in the non-aperture region and configured
 to prevent the spacer from moving into an aperture region
```
Fig.6
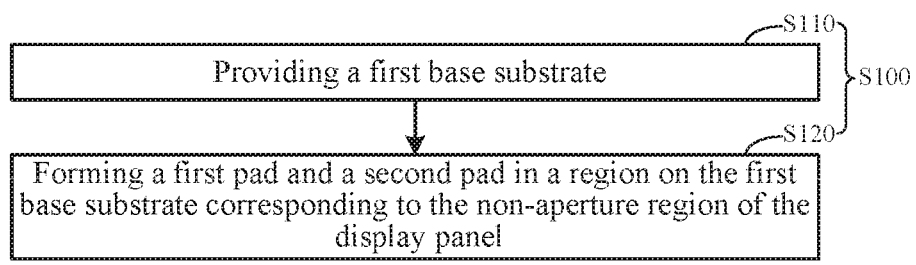
Fig.7

DISPLAY PANEL, METHOD FOR MANUFACTURING SAME, AND DISPLAY DEVICE

CROSS-REFERENCE TO RELATED APPLICATIONS

The present application is based on International Application No. PCT/CN2018/085028, filed on Apr. 28, 2018, which is based upon and claims the priority of Chinese patent application No. 201710703280.6 filed with the SIPO on Aug. 16, 2017 under the title of "A DISPLAY PANEL, A MANUFACTURING METHOD THEREOF AND A DISPLAY DEVICE", and the contents of the above-mentioned Chinese patent application are fully incorporated herein by reference as part of this application.

TECHNICAL FIELD

The present disclosure relates to the field of display technology, and particularly to a display panel, a manufacturing method thereof, and a display device.

BACKGROUND

An existing display panel usually includes two display substrates cell-assembled with each other, a liquid crystal (LC) layer filled between the two display substrates, and a spacer which is disposed in a non-aperture region of one of the two display substrates and is configured to maintain a cell thickness. Taking the display panel including an array substrate and a color filter (CF) substrate in which the spacer is disposed on the array substrate as an example, e.g., the spacer is disposed above gate lines of the array substrate, the spacer can maintain a certain cell thickness between the array substrate and the CF substrate.

However, there still exists a problem that, after the array substrate and the CF substrate are cell-assembled to form a display panel, if the display panel is applied with an external force, the spacer would be moved into an aperture region under the action of the external force, which may affect a display performance of the display panel.

SUMMARY

According to a first aspect of the present disclosure, a display panel is provided. The display panel includes an array substrate which includes a plurality of pixel regions defined by a plurality of gate lines intersected with a plurality of data lines. Each of the pixel regions includes an aperture region, a non-aperture region surrounding the aperture region, and a spacer disposed in the non-aperture region. Each of the pixel regions further includes a padding structure provided in the non-aperture region. The padding structure includes a first pad and a second pad located in the non-aperture region. The first pad and the second pad are located at two sides of the spacer, respectively. The first pad and the second pad are located at two sides of the gate line, respectively. The padding structure is configured to prevent the spacer from moving into the aperture region.

In an arrangement of the present disclosure, the display panel includes a first base substrate and a gate line located in a region of the first base substrate corresponding to the non-aperture region. The spacer is located in an area of the non-aperture region corresponding to the gate line. The padding structure is located on the first base substrate. A total thickness of a film layer structure in a region on the first base substrate corresponding to the first pad is greater than a total thickness of a film layer structure in a region on the first base substrate corresponding to the gate line. A total thickness of a film layer structure in a region on the first base substrate corresponding to the second pad is greater than the total thickness of the film layer structure in the region on the first base substrate corresponding to the gate line.

In an arrangement of the present disclosure, the first pad includes at least one of a first elevated layer located in a same layer with the gate line, a second elevated layer located in a same layer with a data line, and a third elevated layer located in a same layer with an active layer. The second pad includes at least one of a fourth elevated layer located in a same layer with the gate line, a fifth elevated layer located in a same layer with the data line, and a sixth elevated layer located in a same layer with the active layer.

In an arrangement of the present disclosure, the display panel further includes a common electrode line, the common electrode line is located in a same layer with the gate line and is located at one side of the gate line. The first pad corresponds to the common electrode line, and a portion of the common electrode line corresponding to the first pad serves as the first elevated layer. Or, the second pad corresponds to the common electrode line, and a portion of the common electrode line corresponding to the second pad serves as the fourth elevated layer.

According to a second aspect of the present disclosure, a manufacturing method of a display panel for manufacturing the display panel described in the technical solutions above is provided. The manufacturing method of the display panel includes forming a padding structure in a non-aperture region in each of the plurality of pixel regions of the display panel. The padding structure includes a first pad and a second pad located in the non-aperture region. The first pad and the second pad are located at two sides of the spacer, respectively. The first pad and the second pad are located at two sides of the gate line, respectively. The padding structure is configured to prevent the spacer from moving into an aperture region.

In an arrangement of the present disclosure, the spacer is located in an area of the non-aperture region corresponding to a gate line; the padding structure includes a first pad and a second pad. Forming a padding structure in a non-aperture region of the display panel includes providing a first base substrate, and forming the first pad and the second pad in a region on the first base substrate corresponding to the non-aperture region of the display panel. A total thickness of a film layer structure in a region on the first base substrate corresponding to the first pad is greater than a total thickness of a film layer structure in a region on the first base substrate corresponding to the gate line. A total thickness of a film layer structure in a region on the first base substrate corresponding to the second pad is greater than the total thickness of the film layer structure in the region on the first base substrate corresponding to the gate line.

In an arrangement of the present disclosure, the first pad includes at least one of a first elevated layer, a second elevated layer and a third elevated layer. Forming the first pad in a region on the first base substrate corresponding to the non-aperture region of the display panel includes at least one of: forming the first elevated layer in a region on the first base substrate corresponding to the non-aperture region of the display panel, the first elevated layer being located in a same layer with the gate line; forming the second elevated layer in a region on the first base substrate corresponding to the non-aperture region of the display panel, the second elevated layer being located in a same layer with a data line;

and forming the third elevated layer in a region on the first base substrate corresponding to the non-aperture region of the display panel, the third elevated layer being located in a same layer with an active layer.

In an arrangement of the present disclosure, the first elevated layer is formed along with the gate line by a single patterning process. The second elevated layer is formed along with the data line by a single patterning process. The third elevated layer is formed along with the active layer by a single patterning process.

In an arrangement of the present disclosure, the second elevated layer is formed along with the third elevated layer by a single patterning process.

In an arrangement of the present disclosure, the second pad includes at least one of a fourth elevated layer, a fifth elevated layer and a sixth elevated layer. Forming the second pad in a region on the first base substrate corresponding to the non-aperture region of the display panel includes at least one of: forming the fourth elevated layer in a region on the first base substrate corresponding to the non-aperture region of the display panel, the fourth elevated layer being located in a same layer with the gate line; forming the fifth elevated layer in a region on the first base substrate corresponding to the non-aperture region of the display panel, the fifth elevated layer being located in a same layer with a data line; and forming the sixth elevated layer in a region on the first base substrate corresponding to the non-aperture region of the display panel, the sixth elevated layer being located in a same layer with an active layer.

In an arrangement of the present disclosure, the fourth elevated layer is formed along with the gate line by a single patterning process. The fifth elevated layer is formed along with the data line by a single patterning process. The sixth elevated layer is formed along with the active layer by a single patterning process.

In an arrangement of the present disclosure, the fifth elevated layer is formed along with the sixth elevated layer by a single patterning process.

In an arrangement of the present disclosure, the display panel includes a common electrode line, the common electrode line is located in a same layer with the gate line and is located at one side of the gate line. The first pad corresponds to the common electrode line. Forming the first elevated layer in a region on the first base substrate corresponding to the non-aperture region of the display panel includes forming the common electrode line in the region on the first base substrate corresponding to the non-aperture region of the display panel, and a portion of the common electrode line corresponding to the first pad serving as the first elevated layer. Or, the display panel includes a common electrode line. The common electrode line is located in a same layer with the gate line and is located at a side of the gate line. The second pad corresponds to the common electrode line. Forming the fourth elevated layer in a region on the first base substrate corresponding to the non-aperture region of the display panel includes forming the common electrode line in the region on the first base substrate corresponding to the non-aperture region of the display panel, and a portion of the common electrode line corresponding to the second pad serving as the fourth elevated layer.

According to a third aspect of the present disclosure, a display device including the display panel described in the technical solutions above is provided.

According to a fourth aspect of the present disclosure, an array substrate is provided. The array substrate includes a plurality of pixel regions defined by a plurality of gate lines intersected with a plurality of data lines. Each of the pixel regions includes an aperture region, a non-aperture region surrounding the aperture region, and a spacer disposed in the non-aperture region. Each of the pixel regions further includes a padding structure provided in the non-aperture region. The padding structure includes a first pad and a second pad located in the non-aperture region. The first pad and the second pad are located at two sides of the spacer, respectively. The first pad and the second pad are located at two sides of the gate line, respectively. The padding structure is configured to prevent the spacer from moving into the aperture region.

According to a fifth aspect of the present disclosure, a method for manufacturing the above array substrate is provided. The method includes forming a padding structure in a non-aperture region of each of the plurality of pixel regions of the array substrate. The padding structure includes a first pad and a second pad located in the non-aperture region. The first pad and the second pad are located at two sides of the spacer, respectively. The first pad and the second pad are located at two sides of the gate line, respectively. The padding structure is configured to prevent the spacer from moving into an aperture region.

BRIEF DESCRIPTION OF THE DRAWINGS

The accompanying drawings described herein are provided for further understanding of the present disclosure and constitute a part of the present disclosure. The exemplary arrangements of the present disclosure and the descriptions thereof are for the purpose of explaining the present disclosure, and are not to be construed as any limitation to the present disclosure. In the accompanying drawings:

FIG. 5 is a sectional view taken along B-B of FIG. 4;

FIG. 6 is a first flow chart of a manufacturing method of a display panel provided by an arrangement of the present disclosure;

FIG. 7 is a second flow chart of a manufacturing method of a display panel provided by an arrangement of the present disclosure;

DETAILED DESCRIPTION

Hereinafter, exemplary arrangements of the present disclosure will be described in more details with reference to the accompanying drawings so as to further explain the display panel, the manufacturing method thereof and the display device provided by the arrangements of the present disclosure.

Figure 1:
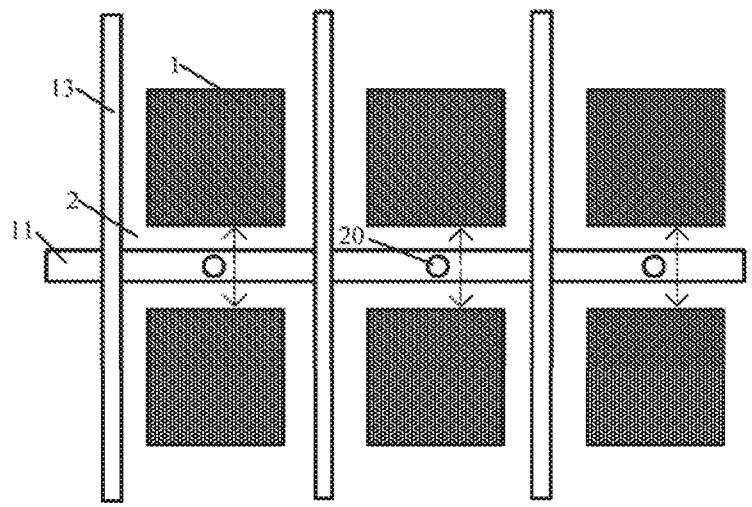
FIG. 1 is a plan view of a display panel provided by an arrangement related to the present disclosure.

FIG. 1 is a plan view of a display panel provided by an arrangement related to the present disclosure. As illustrated in FIG. 1, an array substrate includes a plurality of pixel regions defined by a plurality of gate lines 11 intersected with a plurality of data lines 13. Each of the pixel regions includes an aperture region 1 (i.e., the aperture region of the display panel) and a non-aperture region 2 (i.e., the non-aperture region of the display panel) surrounding the aperture region 1. A spacer 20 usually is disposed in an area of the non-aperture region 2 corresponding to the gate line.

Based on the structure above, the spacer 20 disposed in the non-aperture region 2 of the array substrate, although having the ability of supporting a cell body so as to maintain a cell thickness, still involves problems as below: after the array substrate is cell-assembled with a color filter (CF) substrate to form the display panel, if the display panel is applied with a certain external force, the spacer 20 may be moved into the aperture region 1 under the action of the external force, which would not only affect an arrangement of liquid crystals (LCs) around the spacer 20 but also block light transmitted through the aperture region 1, thus resulting in a decrease of an aperture ratio and influencing a display performance of the display panel.

Please refer to FIG. 2 and FIG. 3 or FIG. 4 and FIG. 5, a display panel provided by an arrangement of the present disclosure includes an aperture region 1, a non-aperture region 2 surrounding the aperture region 1, and a spacer 20 disposed in the non-aperture region 2. The non-aperture region 2 is further provided with a padding structure 30, the padding structure 30 is located near the spacer 20 and is configured to prevent the spacer 20 from moving into the aperture region 1.

By way of example, the display panel provided by the arrangement of the present disclosure includes an array substrate and a CF substrate which are cell-assembled with each other. The array substrate incudes a first base substrate 10 and a plurality of pixel regions located on the first base substrate 10, the plurality of pixels are defined by a plurality of gate lines 11 intersected with a plurality of data lines 13. Each of the pixel regions includes an aperture region 1 (i.e., the aperture region 1 of the display panel) and a non-aperture region 2 (i.e., the non-aperture region of the display panel) surrounding the aperture region 1. Each of the pixel regions is provided with a corresponding pixel unit. Each pixel unit includes a thin film transistor (TFT) 14 and a pixel electrode 16. The TFT 14 may be a bottom-gate TFT, and the TFT 14 includes a gate electrode 141, a gate insulating layer 142, an active layer 143, a source electrode 144 and a drain electrode 145.

The gate electrode 141 of the TFT 14 is located on a first base substrate 10, and the gate electrode 141 is connected to a corresponding gate line 11. The gate electrode 141 and the gate line 11 are formed by a single patterning process. A material of the gate electrode 141 and the gate line 11 may be selected as a single metal material such as copper (Cu), aluminum (Al), molybdenum (Mo), titanium (Ti), chromium (Cr) and tungsten (W), and may also be selected as an alloy material consisted of at least two of the single metal materials described above. A structure of the gate line 11 and the gate electrode 141 in a direction perpendicular to the first base substrate 10 may be a single-layered structure, and may also be a multi-layered structure. When the gate line 11 and the gate electrode 141 are in a multi-layered structure, it may include a sandwiched structure consisted of two Mo structural layers and one Al structural layer (i.e., a Mo\Al\Mo structure), or it may include a sandwiched structure consisted of two Ti structural layers and one Cu structural layer (i.e., a Ti\Cu\Ti structure), or, it may include a double-layered structure consisted of a Mo—Ti alloy structural layer and a Cu structural layer (i.e., a MoTi\Cu structure).

The gate insulating layer 142 covers the first base substrate 10 and the gate electrode 141. A material of the gate insulating layer 142 may adopt silicon nitride or silicon oxide. The gate insulating layer 142 may be a single-layered structure and may also be a multi-layered structure. When the gate insulating layer 142 is a multi-layered structure, it may include a double-layered structure consisted of a silicon oxide structural layer and a silicon nitride structural layer (i.e., a silicon oxide\silicon nitride structure).

The active layer 143 is located on the gate insulating layer 142 and is corresponding to the gate electrode 141. A material of the active layer 143 may be amorphous silicon, monocrystalline silicon, polycrystalline silicon or metal oxide semiconductor material. When the material of the active layer 143 is selected as a metal oxide semiconductor material, in may be Indium Gallium Zinc Oxide (IGZO), zinc oxide (ZnO) or the like.

The source electrode 144 and the drain electrode 145 are in contact with the active layer 143, respectively. The source electrode 144, the drain electrode 145 and the data line 13 are disposed in a same layer and are formed by a single patterning process. The source electrode 144 is connected to a corresponding data line 13, and the drain electrode 145 is connected to a corresponding pixel electrode 16. A material of the source electrode 144, the drain electrode 145 and the data line 13 may be selected as a single metal material such as copper (Cu), aluminum (Al), molybdenum (Mo), titanium (Ti), chromium (Cr) and tungsten (W), and may also be selected as an alloy material consisted of at least two of the single metal materials described above. A structure of the source electrode 144, the drain electrode 145 and the data line 13 in the direction perpendicular to the first base substrate 10 may be a single-layered structure, and may also be a multi-layered structure. When the source electrode 144, the drain electrode 145 and the data line 13 are in a multi-layered structure, it may include a sandwiched structure consisted of two Mo structural layers and one Al structural layer (i.e., a Mo\Al\Mo structure), or it may include a sandwiched structure consisted of two Ti structural layers and one Cu structural layer (i.e., a Ti\Cu\Ti structure), or, it may include a double-layered structure consisted of a Mo—Ti alloy structural layer and a Cu structural layer (i.e., a MoTi\Cu structure).

The pixel electrode 16 is located above the TFT 14, and is located in a corresponding aperture region 1. A passivation layer 15 is formed between the pixel electrode 16 and the TFT 14, and the passivation layer 15 covers the gate insulating layer 142, the source electrode 144, the drain electrode 145, the data line 13 and the active layer 143. A material of the passivation layer 15 may adopt silicon nitride or silicon oxide. The passivation layer 15 may be a single-layered structure and may also be a multi-layered structure. When the passivation layer 15 is a multi-layered structure, it can include a double-layered structure consisted of a silicon oxide structural layer and a silicon nitride structural layer (i.e., a silicon oxide\silicon nitride structure).

A portion of the passivation layer 15 corresponding to the drain electrode 145 is provided with a via hole, and the pixel electrode 16 is connected to a corresponding drain electrode 145 through a corresponding via hole. A material of the pixel electrode 16 may be selected as Indium Tin Oxide (ITO), Indium Zinc Oxide (IZO) or other transparent metal oxide conductive materials.

The CF substrate includes a second base substrate 40, as well as a black matrix 42 and a CF layer 41 which are formed on the second base substrate 40. The black matrix 42 defines a plurality of aperture regions 1 (i.e., the aperture region 1 of the display panel. The non-aperture region 2 of the display panel corresponds to the black matrix 42). The black matrix 42 corresponds to the gate line 11, the data line 13 and the TFT 14. The CF layer 41 is located in a region on the second base substrate 40 corresponding to the aperture region 1.

A spacer 20 is formed between the array substrate and the CF substrate. When the array substrate is cell-assembled with the CF substrate, the spacer 20 is configured to support the cell body so as to maintain a certain cell thickness. The spacer 20 may be disposed in a region on the array substrate corresponding to the non-aperture region 2 (it may also be interpreted as a region corresponding to the black matrix 42), and located in an area of the non-aperture region 2 corresponding to the gate line 11 on the array substrate. Or, the spacer 20 may also be disposed in a region on the CF substrate corresponding to the non-aperture region 2, and located in an area of the non-aperture region 2 corresponding to the gate line 11 on the array substrate. It may also be interpreted that, the spacer 20 is disposed in a region of the black matrix 42 on the CF substrate corresponding to the gate line 11. The non-aperture region 2 is further provided with a padding structure 30, the padding structure 30 may be disposed in a region on the array substrate corresponding to the non-aperture region 2, and may also be disposed in a region on the CF substrate corresponding to the non-aperture region 2. The padding structure 30 is located near the spacer 20, and is configured to limit a position of the spacer 20 so as to prevent the spacer 20 from moving into the aperture region 1 of the display panel.

As it can be seen from the analysis above, in the display panel provided by the arrangement of the present disclosure, by means of the padding structure 30 disposed in the non-aperture region 2 of the display panel and located near the spacer 20, the position of the spacer 20 can be limited, so as to prevent the spacer 20 from moving into the aperture region 1 of the display panel. In this way, it can avoid any change of the arrangement of the LCs around the spacer 20 resulted by a shift of position of the spacer 20, and also prevents the spacer 20 from blocking light emitted through the aperture region 1 resulted by the spacer 20 moving into the aperture region 1, so as to avoid any influence on the arrangement of the LCs and the aperture ration of the display panel resulted by the spacer 20 moving into the aperture region 1, thus improving the display performance of the display panel.

In the arrangement above, the padding structure 30 is disposed in the non-aperture region 2 and is located near the spacer 20. For example, the padding structure 30 may be disposed at one side of the spacer 20. Or, the padding structure 30 may be disposed at two opposite sides of the spacer 20. Or, the padding structure 30 may be disposed to surround the spacer 20. In the arrangement of the present disclosure, still referring to FIG. 2 and FIG. 3 or FIG. 4 and FIG. 5, the display panel provided by the arrangement of the present disclosure includes a first base substrate 10, and a gate line 11 located in a region on the first base substrate 10 corresponding to the non-aperture region 2. The spacer 20 is located in an area of the non-aperture region 2 corresponding to the gate line 11. The padding structure is located on the first base substrate 10. The padding structure 30 includes a first pad 31 and a second pad 32 located in the non-aperture region 2. The first pad 31 and the second pad 32 are located at two sides of the spacer 20, respectively. The first pad 31 and the second pad 32 are located at two sides of the gate line 11, respectively. A total thickness of a film layer structure in a region on the first base substrate 10 corresponding to the first pad 31 is greater than a total thickness of a film layer structure in a region on the first base substrate 10 corresponding to the gate line 11. A total thickness of a film layer structure in a region on the first base substrate 10 corresponding to the second pad 32 is greater than the total thickness of the film layer structure in the region on the first base substrate 10 corresponding to the gate line 11.

Figure 2:
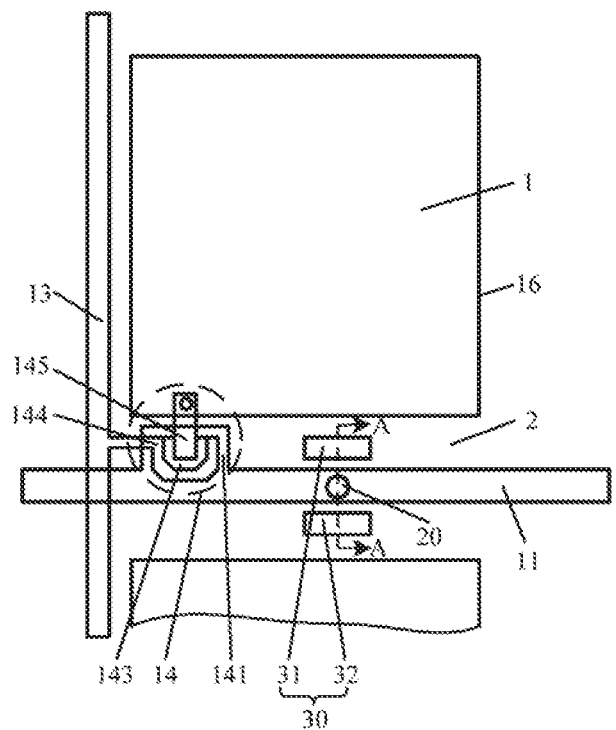
FIG. 2 is a plan view of a display panel provided by an arrangement of the present disclosure.
Figure 3:
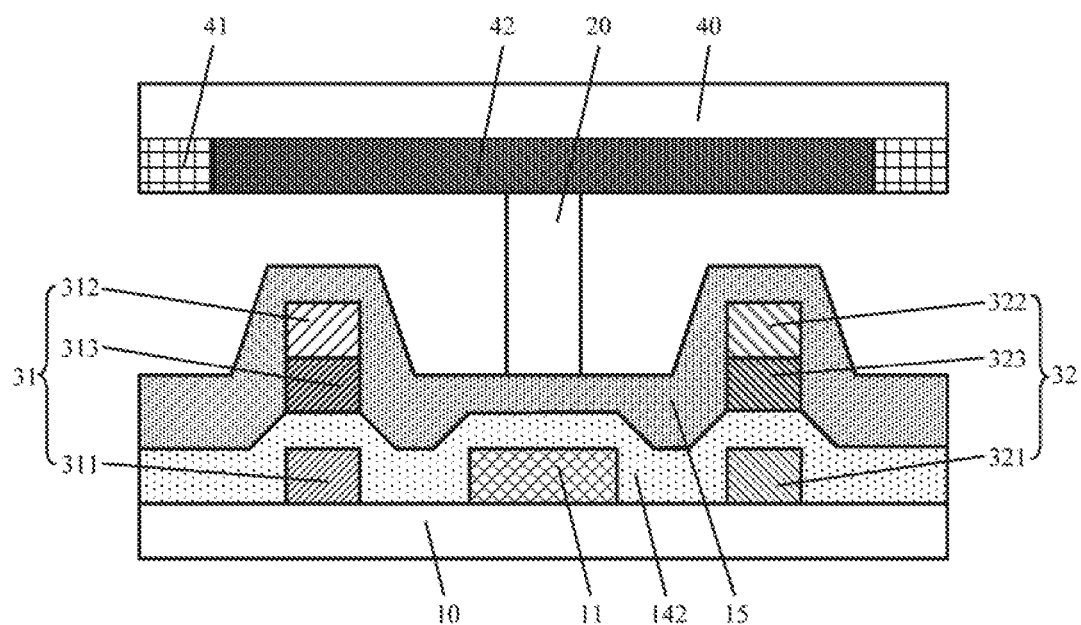
FIG. 3 is a sectional view taken along A-A of FIG. 2.

Still referring to FIG. 2 and FIG. 3 or FIG. 4 and FIG. 5, the spacer 20 is located in an area of the non-aperture region 2 corresponding to the gate line 11, for example, the spacer 20 is located right above the gate line 11 as illustrated in FIG. 3 or FIG. 5. The padding structure 30 includes a first pad 31 and a second pad 32. The first pad 31 and the second pad 32 are located at two sides of the spacer 20, respectively. The first pad 31 and the second pad 32 are located at two sides of the gate line 11, respectively. For example, the first pad 31 is located between an upper aperture region 1 illustrated in FIG. 2 or FIG. 4 and the spacer 20; and the second pad 32 is located between a lower aperture region 1 illustrated in FIG. 2 or FIG. 4 and the spacer 20. A total thickness of a film layer structure in a region on the first base substrate 10 corresponding to the first pad 31 is greater than a total thickness of a film layer structure in a region on the first base substrate 10 corresponding to the gate line 11. A total thickness of a film layer structure in a region on the first base substrate 10 corresponding to the second pad 32 is greater than the total thickness of the film layer structure in the region on the first base substrate 10 corresponding to the gate line 11.

For example, still referring to FIG. 2 and FIG. 3, film layers in a region on the first base substrate 10 corresponding to the first pad 31 include a first pad 31, a gate insulating layer 142 and a passivation layer 15. Film layers in a region on the first base substrate 10 corresponding to the second pad 32 include a second pad 32, a gate insulating layer 142 and a passivation layer 15. Film layers in a region on the first base substrate 10 corresponding to the gate line 11 include a gate line 11, a gate insulating layer 142 and a passivation layer 15. A total thickness of the first pad 31, the gate insulating layer 142 and the passivation layer 15 is greater than a total thickness of the gate line 11, the gate insulating layer 142 and the passivation layer 15. A total thickness of the second pad 32, the gate insulating layer 142 and the passivation layer 15 is greater than the total thickness of the gate line 11, the gate insulating layer 142 and the passivation layer 15. That is, as illustrated in FIG. 3 or FIG. 5, a region on a top of the first base substrate 10 corresponding to the spacer 20 is formed into a groove, and the spacer 20 is located in the groove. A groove wall of the groove blocks both sides of the spacer 20 so as to prevent the spacer 20 from moving into the aperture region 1.

The first pad 31 and the second pad 32 are disposed at opposite two sides of the spacer 20 respectively, and are located at two sides of the gate line 11 respectively. A result, the first pad 31 and the second pad 32 are respectively located between a corresponding aperture region 1 and the spacer 20 to block the spacer 20 and limit the position of the spacer 20, so as to prevent the spacer 20 from moving into the aperture region 1.

In the arrangement above, the first pad 31 may be arranged in various forms. For example, referring to FIG. 2 and FIG. 3, the first pad 31 may include: a first elevated layer 311 located in a same layer with the gate line 11, and/or, a second elevated layer 312 located in a same layer with the data line 13, and/or, a third elevated layer 313 located in a same layer with the active layer 143. That is to say, the first pad 31 may include at least one of the first elevated layer 311, the second elevated layer 312 and the third elevated layer 313. Description will be given with reference to FIG. 3 by way of example, film layers in a region on the first base substrate 10 corresponding to the gate line 11 include a gate line 11, a gate insulating layer 142 and a passivation layer 15. Film layers in a region on the first base substrate 10 corresponding to the first pad 31 include a first pad 31, a gate insulating layer 142 and a passivation layer 15. When the first pad 31 includes at least one of the first elevated layer 311, the second elevated layer 312 and the third elevated layer 313, a thickness of the first pad 31 is greater than a thickness of the gate line 11, so that a total thickness of a film layer structure in a region on the first base substrate 10 corresponding to the first pad 31 is greater than a total thickness of a film layer structure in a region on the first base substrate 10 corresponding to the gate line 11. That is, when the first pad 31 includes only the first elevated layer 311, a thickness of the first elevated layer 311 is greater than a thickness of the gate line 11. When the first pad 31 includes only the second elevated layer 312, a thickness of the second elevated layer 312 is greater than a thickness of the data line 13. When the first pad 31 includes only the third elevated layer 313, a thickness of the third elevated layer 313 is greater than a thickness of the active layer 143.

In the arrangement above, the first elevated layer 311 is located in a same layer with the gate line 11. The first elevated layer 311 may be formed separately, and may also be formed along with the gate line 11 by a single patterning process. In at least one arrangement of the present disclosure, the first elevated layer 311 may be formed along with the gate line 11 by a single patterning process. The second elevated layer 312 is located in a same layer with the data line 13. The second elevated layer 312 may be formed separately, and may also be formed along with the data line 13 by a single patterning process. In at least one arrangement of the present disclosure, the second elevated layer 312 may be formed along with the data line 13 by a single patterning process. The third elevated layer 313 is located in a same layer with the active layer 143. The third elevated layer 313 may be formed separately, and may also be formed along with the active layer 143 by a single patterning process. In at least one arrangement of the present disclosure, the third elevated layer 313 may be formed along with the active layer 143 by a single patterning process. By forming the first elevated layer 311 and the gate line 11 by a single patterning process, by forming the second elevated layer 312 and the data line 13 by a single patterning process, and by forming the third elevated layer 313 and the active layer 143 by a single patterning process, the complexity in manufacturing the display panel can be reduced, and the number of mask necessary for manufacturing the display panel can be decreased, so as to lower the cost of manufacturing the display panel and improve the efficiency of manufacturing the display panel.

Similarly, the second pad 32 may be arranged in various forms. For example, referring to FIG. 2 and FIG. 3, the second pad 32 may include: a fourth elevated layer 321 located in a same layer with the gate line 11, and/or, a fifth elevated layer 322 located in a same layer with the data line 13, and/or, a sixth elevated layer 323 located in a same layer with the active layer 143. That is to say, the second pad 32 may include at least one of the fourth elevated layer 321, the fifth elevated layer 322 and the sixth elevated layer 323. Description will be given with reference to FIG. 3 by way of example, film layers in a region on the first base substrate 10 corresponding to the gate line 11 include a gate line 11, a gate insulating layer 142 and a passivation layer 15. Film layers in a region on the first base substrate 10 corresponding to the second pad 32 include a second pad 32, a gate insulating layer 142 and a passivation layer 15. When the second pad 32 includes at least one of a fourth elevated layer 321, a fifth elevated layer 322 and a sixth elevated layer 323, a thickness of the second pad 32 is greater than a thickness of the gate line 11, so that a total thickness of a film layer structure in a region on the first base substrate 10 corresponding to the second pad 32 is greater than a total thickness of a film layer structure in a region on the first base substrate 10 corresponding to the gate line 11. That is, when the second pad 32 includes only the fourth elevated layer 321, a thickness of the second elevated layer 321 is greater than a thickness of the gate line 11. When the second pad 32 includes only the fifth elevated layer 322, a thickness of the fifth elevated layer 322 is greater than a thickness of the data line 13. When the second pad 32 includes only the sixth elevated layer 323, a thickness of the sixth elevated layer 323 is greater than a thickness of the active layer 143.

In the arrangement above, the fourth elevated layer 321 is located in a same layer with the gate line 11. The fourth elevated layer 321 may be formed separately, and may also be formed along with the gate line 11 by a single patterning process. In at least one arrangement of the present disclosure, the fourth elevated layer 321 may be formed along with the gate line 11 by a single patterning process. The fifth elevated layer 322 is located in a same layer with the data line 13. The fifth elevated layer 322 may be formed separately, and may also be formed along with the data line 13 by a single patterning process. In at least one arrangement of the present disclosure, the fifth elevated layer 322 may be formed along with the data line 13 by a single patterning process. The sixth elevated layer 323 is located in a same layer with the active layer 143. The sixth elevated layer 323 may be formed separately, and may also be formed along with the active layer 143 by a single patterning process. In at least one arrangement of the present disclosure, the sixth elevated layer 323 may be formed along with the active layer 143 by a single patterning process. By forming the fourth elevated layer 321 and the gate line 11 by a single patterning process, by forming the fifth elevated layer 322 and the data line 13 by a single patterning process, and by forming the sixth elevated layer 323 and the active layer 143 by a single patterning process, the complexity in manufacturing the display panel can be reduced, and the number of mask necessary for manufacturing the display panel can be decreased, so as to lower the cost of manufacturing the display panel and improve the efficiency of manufacturing the display panel.

Figure 4:
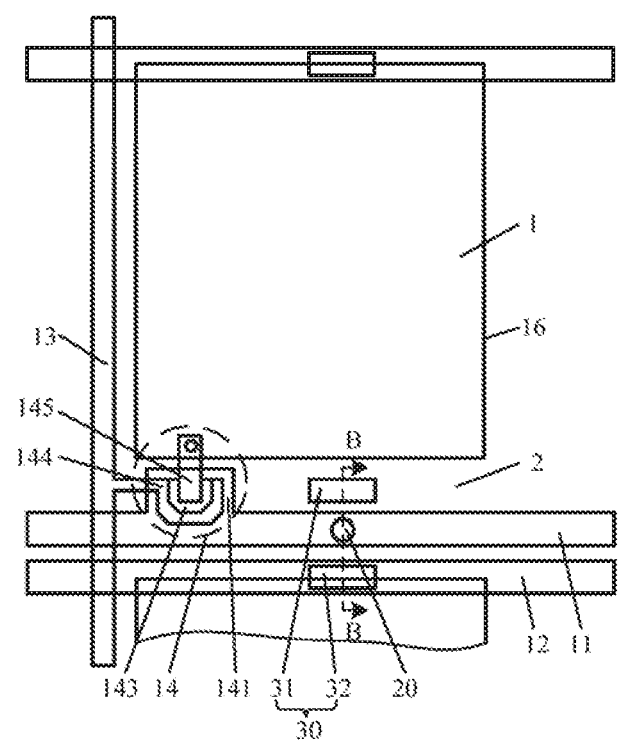
FIG. 4 is a plan view of another display panel provided by an arrangement of the present disclosure.

Referring to FIG. 4 and FIG. 5, when the display panel further includes a common electrode line 12, the common electrode line 12 is located in a same layer with the gate line 11, and the common electrode line 12 is located at one side of the gate line 11. In such case, the first pad 31 may be arranged to correspond to the common electrode line 12, and a portion of the common electrode line 12 corresponding to the first pad 31 may serve as the first elevated layer 311 of the first pad 31. Or, referring to FIG. 4 and FIG. 5, the second pad 32 may also be arranged to correspond to the common electrode line 12, and a portion of the common electrode line 12 corresponding to the second pad 32 may serve as the fourth elevated layer 321 of the second pad 32. That is to say, there is no need of additionally arranging a first elevated layer 311 or a fourth elevated layer 321. With such design, it can eliminate the need of reserving an area in the non-aperture region 2 for an arrangement of the first pad 31 and the second pad 32 which is necessary for additionally providing a first elevated layer 311 and a fourth elevated layer 312, so as to reduce the area of the non-aperture region 2 and improve the aperture ratio.

Furthermore, the portion of the common electrode line 12 corresponding to the first pad 31 serves as the first elevated layer 311 of the first pad, or, the portion of the common electrode line 12 corresponding to the second pad 32 serves as the fourth elevated layer 321 of the second pad 32, and the common electrode line 12 is formed in a same layer with the gate line 11 so that the common electrode line 12 can be formed along with the gate line 11 by a single patterning process. In this way, the complexity in manufacturing the display panel can be reduced and the number of mask necessary for manufacturing the display panel can be decreased, so as to lower the cost of manufacturing the display panel and improve the efficiency of manufacturing the display panel.

Moreover, the portion of the common electrode line 12 corresponding to the first pad 31 serves as the first elevated layer 311 of the first pad, or, the portion of the common electrode line 12 corresponding to the second pad 32 serves as the fourth elevated layer 321 of the second pad 32. In this way, providing a small region on the mask to form the first elevated layer 311 or the fourth elevated layer 321 may not be needed, which can simplify the structure of the mask, and hence can lower the cost of manufacturing the display panel.

The arrangement of the present disclosure further provides a display device, and the display device includes the display panel described in the arrangements above.

As compared with the prior art, the display device possesses substantially similar improvements with those of the display panel described above, without repeating herein.

Referring to FIG. 6, an arrangement of the present disclosure further provides a manufacturing method of a display panel, for manufacturing the display panel described in the arrangements above. The manufacturing method of the display panel includes blocks as discussed below.

In block S100, a padding structure is formed in a non-aperture region of the display panel. The padding structure is located near a spacer disposed in the non-aperture region and is configured to prevent the spacer from moving into an aperture region.

Various arrangements are described in the present description in a progressive manner, and identical or similar contents between different arrangements may be referred to each other. Each of the arrangements will be emphasized on its distinction from others. Especially, the arrangements of the manufacturing method of the display panel are substantially similar to those of the display panel and hence will be described briefly. The related contents may be referred to the corresponding description in the arrangements of the display panel.

In the case where the spacer is located in an area of the non-aperture region corresponding to the gate line and the padding structure includes a first pad and a second pad, referring to FIG. 7, the block S100 of forming a padding structure in a non-aperture region of the display panel includes the following blocks.

In block S110, a first base substrate is provided.

In block S120, a first pad and a second pad are formed in a region on the first base substrate corresponding to the non-aperture region of the display panel, in which the first pad and the second pad are located at two sides of the spacer, respectively, and the first pad and the second pad are located at two sides of the gate line, respectively. A total thickness of a film layer structure in a region on the first base substrate corresponding to the first pad is greater than a total thickness of a film layer structure in a region on the first base substrate corresponding to the gate line; and a total thickness of a film layer structure in a region on the first base substrate corresponding to the second pad is greater than the total thickness of the film layer structure in the region on the first base substrate corresponding to the gate line.

The first pad may include at least one of: a first elevated layer located in a same layer with the gate line, a second elevated layer located in a same layer with a data line, and a third elevated layer located in a same layer with an active layer. In the case where the first pad includes a first elevated layer, referring to FIG. 8, the block S120 of forming the first pad in a region on the first base substrate corresponding to the non-aperture region of the display panel may include the following blocks.

In block S121, a first elevated layer is formed in a region on the first base substrate corresponding to the non-aperture region of the display panel, and the first elevated layer is located in a same layer with the gate line.

Figure 8:
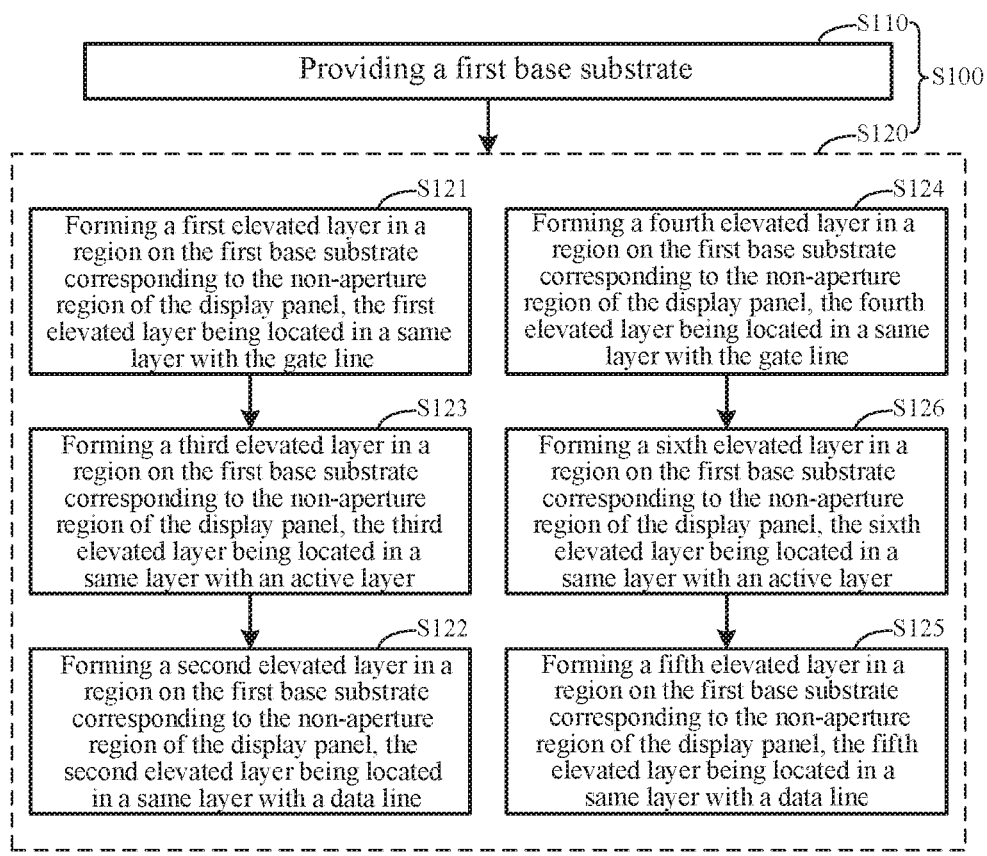
FIG. 8 is a third flow chart of a manufacturing method of a display panel provided by an arrangement of the present disclosure.

In the case where the first pad includes a second elevated layer, referring to FIG. 8, the block S120 of forming a first pad in a region on the first base substrate corresponding to the non-aperture region of the display panel may include the following block S122.

In block S122, a second elevated layer is formed in a region on the first base substrate corresponding to the non-aperture region of the display panel, the second elevated layer being located in a same layer with a data line.

In the case where the first pad includes a third elevated layer, referring to FIG. 8, the block S120 of forming a first pad in a region on the first base substrate corresponding to the non-aperture region of the display panel may include block S123.

In block S123, a third elevated layer is formed in a region on the first base substrate corresponding to the non-aperture region of the display panel, the third elevated layer being located in a same layer with an active layer.

In the case where the first pad includes a first elevated layer and a second elevated layer, referring to FIG. 8, the block S120 of forming a first pad in a region on the first base substrate corresponding to the non-aperture region of the display panel may include the following blocks.

In block S121, a first elevated layer is formed in a region on the first base substrate corresponding to the non-aperture region of the display panel, the first elevated layer being located in a same layer with the gate line.

In block S122, a second elevated layer is formed in a region on the first base substrate corresponding to the non-aperture region of the display panel, the second elevated layer being located in a same layer with a data line.

In the case where the first pad includes a first elevated layer and a third elevated layer, referring to FIG. 8, the block S120 of forming a first pad in a region on the first base substrate corresponding to the non-aperture region of the display panel may include the following blocks.

In block S121, a first elevated layer is formed in a region on the first base substrate corresponding to the non-aperture region of the display panel, the first elevated layer being located in a same layer with the gate line.

In block S123, a third elevated layer is formed in a region on the first base substrate corresponding to the non-aperture region of the display panel, the third elevated layer being located in a same layer with an active layer.

In the case where the first pad includes a second elevated layer and a third elevated layer, referring to FIG. 8, the block S120 of forming a first pad in a region on the first base substrate corresponding to the non-aperture region of the display panel may include the following blocks.

In block S123, a third elevated layer is formed in a region on the first base substrate corresponding to the non-aperture region of the display panel, the third elevated layer being located in a same layer with an active layer.

In block S122, a second elevated layer is formed in a region on the first base substrate corresponding to the non-aperture region of the display panel, the second elevated layer being located in a same layer with a data line.

In the case where the first pad includes a first elevated layer, a second elevated layer and a third elevated layer, referring to FIG. 8, the block S120 of forming a first pad in a region on the first base substrate corresponding to the non-aperture region of the display panel may include the following blocks.

In block S121, a first elevated layer is formed in a region on the first base substrate corresponding to the non-aperture region of the display panel, the first elevated layer being located in a same layer with the gate line.

In block S123, a third elevated layer is formed in a region on the first base substrate corresponding to the non-aperture region of the display panel, the third elevated layer being located in a same layer with an active layer.

In block S122, a second elevated layer is formed in a region on the first base substrate corresponding to the non-aperture region of the display panel, the second elevated layer being located in a same layer with a data line.

In the block S121, the first elevated layer may be formed along with the gate line by a single patterning process. In the block S122, the second elevated layer may be formed along with the data line by a single patterning process. In the block S123, the third elevated layer may be formed along with the active layer by a single patterning process. In this way, the complexity in manufacturing the display panel can be reduced, and the number of mask necessary for manufacturing the display panel can be decreased, so as to lower the cost of manufacturing the display panel and improve the efficiency of manufacturing the display panel.

In the arrangement above, in the case where the first pad includes both of a second elevated layer and a third elevated layer, i.e., the first pad includes a second elevated layer and a third elevated layer or the first pad includes a first elevated layer, a second elevated layer and a third elevated layer, the second elevated layer and the third elevated layer may be formed by a single patterning process. In such case, the second elevated layer is located in a same layer with the data line, and the third elevated layer is located in a same layer with the active layer; correspondingly, when forming the second elevated layer and the third elevated layer, an active layer material layer is formed firstly and a data line material layer is formed subsequently, and then the active layer, the data line, the second elevated layer and the third elevated layer are formed simultaneously by using a mask such as halftone mask; in this way, the complexity in manufacturing the display panel can be reduced, and the number of mask necessary for manufacturing the display panel can be decreased, so as to lower the cost of manufacturing the display panel and improve the efficiency of manufacturing the display panel.

The second pad may include at least one of a fourth elevated layer, a fifth elevated layer, and a sixth elevated layer. In the case where the second pad includes a fourth elevated layer, referring to FIG. 8, the block S120 of forming a second pad in a region on the first base substrate corresponding to the non-aperture region of the display panel may include the following block.

In block S124, a fourth elevated layer is formed in a region on the first base substrate corresponding to the non-aperture region of the display panel, the fourth elevated layer being located in a same layer with the gate line.

In the case where the second pad includes a fifth elevated layer, referring to FIG. 8, the block S120 of forming a second pad in a region on the first base substrate corresponding to the non-aperture region of the display panel may include the following block.

In block S125, a fifth elevated layer is formed in a region on the first base substrate corresponding to the non-aperture region of the display panel, the fifth elevated layer being located in a same layer with a data line.

In the case where the second pad includes a sixth elevated layer, referring to FIG. 8, the block S120 of forming a second pad in a region on the first base substrate corresponding to the non-aperture region of the display panel may include the following block.

In block S126, a sixth elevated layer is formed in a region on the first base substrate corresponding to the non-aperture region of the display panel, the sixth elevated layer being located in a same layer with an active layer.

In the case where the second pad includes a fourth elevated layer and a fifth elevated layer, referring to FIG. 8, the block S120 of forming a second pad in a region on the first base substrate corresponding to the non-aperture region of the display panel may include the following blocks.

In block S124, a fourth elevated layer is formed in a region on the first base substrate corresponding to the non-aperture region of the display panel, the fourth elevated layer being located in a same layer with the gate line.

In block S125, a fifth elevated layer is formed in a region on the first base substrate corresponding to the non-aperture region of the display panel, the fifth elevated layer being located in a same layer with a data line.

In the case where the second pad includes a fourth elevated layer and a sixth elevated layer, referring to FIG. 8, the block S120 of forming a second pad in a region on the first base substrate corresponding to the non-aperture region of the display panel may include the following blocks.

In block S124, a fourth elevated layer is formed in a region on the first base substrate corresponding to the non-aperture region of the display panel, the fourth elevated layer being located in a same layer with the gate line.

In block S126, a sixth elevated layer is formed in a region on the first base substrate corresponding to the non-aperture region of the display panel, the sixth elevated layer being located in a same layer with an active layer.

In the case where the second pad includes a fifth elevated layer and a sixth elevated layer, referring to FIG. 8, the block S120 of forming a second pad in a region on the first base substrate corresponding to the non-aperture region of the display panel may include the following blocks.

In block S126, a sixth elevated layer is formed in a region on the first base substrate corresponding to the non-aperture region of the display panel, the sixth elevated layer being located in a same layer with an active layer.

In block S125, a fifth elevated layer is formed in a region on the first base substrate corresponding to the non-aperture region of the display panel, the fifth elevated layer being located in a same layer with a data line.

In the case where the second pad includes a fourth elevated layer, a fifth elevated layer and a sixth elevated layer, referring to FIG. 8, the block S120 of forming a second pad in a region on the first base substrate corresponding to the non-aperture region of the display panel may include the following blocks.

In block S124, a fourth elevated layer is formed in a region on the first base substrate corresponding to the non-aperture region of the display panel, the fourth elevated layer being located in a same layer with the gate line.

In block S126, a sixth elevated layer is formed in a region on the first base substrate corresponding to the non-aperture region of the display panel, the sixth elevated layer being located in a same layer with an active layer.

In block S125, a fifth elevated layer is formed in a region on the first base substrate corresponding to the non-aperture region of the display panel, the fifth elevated layer being located in a same layer with a data line.

In the block S124, the fourth elevated layer may be formed along with the gate line by a single patterning process. In the block S125, the fifth elevated layer may be formed along with the data line by a single patterning process. In the block S126, the sixth elevated layer may be formed along with the active layer by a single patterning process. In this way, the complexity in manufacturing the display panel can be reduced, and the number of mask necessary for manufacturing the display panel can be decreased, so as to lower the cost of manufacturing the display panel and improve the efficiency of manufacturing the display panel.

In the arrangement above, in the case where the second pad includes both of a fifth elevated layer and a sixth elevated layer, i.e., the second pad includes a fifth elevated layer and a sixth elevated layer or the second pad includes a fourth elevated layer, a fifth elevated layer and a sixth elevated layer, the fifth elevated layer and the sixth elevated layer may be formed by a single patterning process. In such case, the fifth elevated layer is located in a same layer with the data line, and the sixth elevated layer is located in a same layer with the active layer; correspondingly, when forming the fifth elevated layer and the sixth elevated layer, an active layer material layer is formed firstly and a data line material layer is formed subsequently, and then the active layer, the data line, the fifth elevated layer and the sixth elevated layer are formed simultaneously by using a mask such as halftone mask; in this way, the complexity in manufacturing the display panel can be reduced, and the number of mask necessary for manufacturing the display panel can be decreased, so as to lower the cost of manufacturing the display panel and improve the efficiency of manufacturing the display panel.

Figure 9:
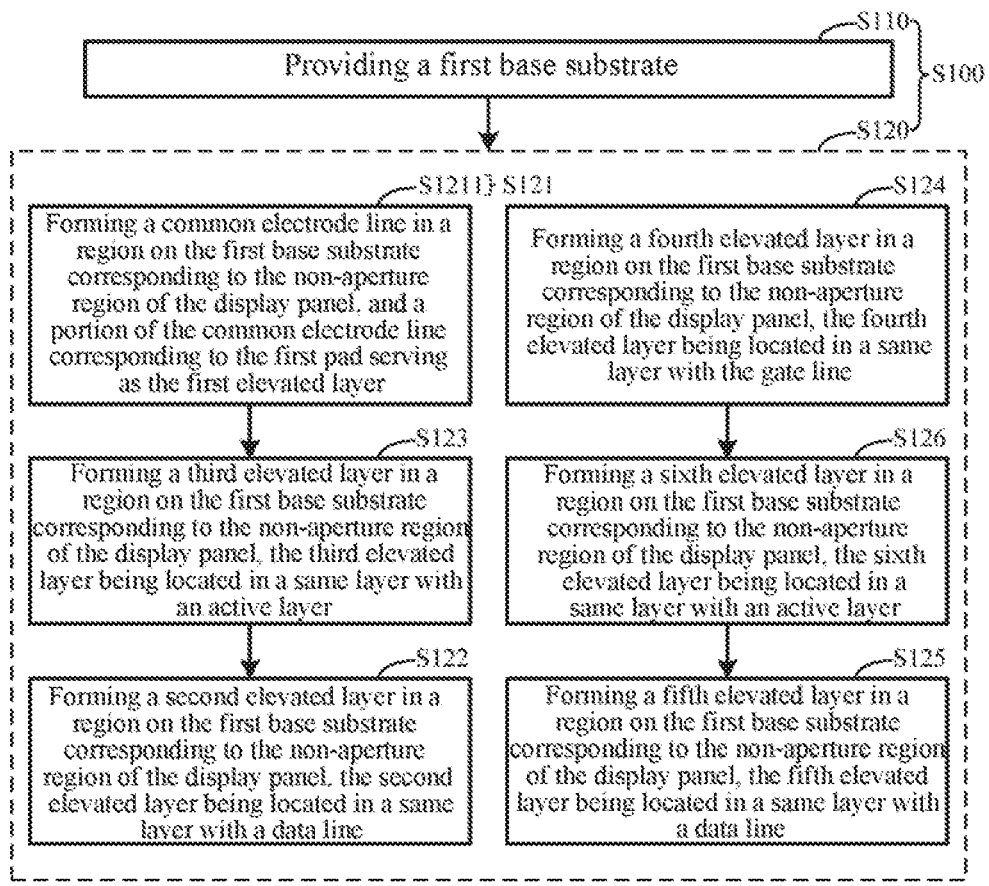
FIG. 9 is a fourth flow chart of a manufacturing method of a display panel provided by an arrangement of the present disclosure.

In the case where the display panel further includes a common electrode line, the common electrode line is located in a same layer with the gate line and is located at one side of the gate line, the first pad may correspond to the common electrode line. In such case, referring to FIG. 9, the block S121 of forming a first elevated layer in a region on the first base substrate corresponding to the non-aperture region of the display panel includes the following block.

In block S1211, a common electrode line is formed in a region on the first base substrate corresponding to the non-aperture region of the display panel, and a portion of the common electrode line corresponding to the first pad serving as the first elevated layer.

Figure 10:
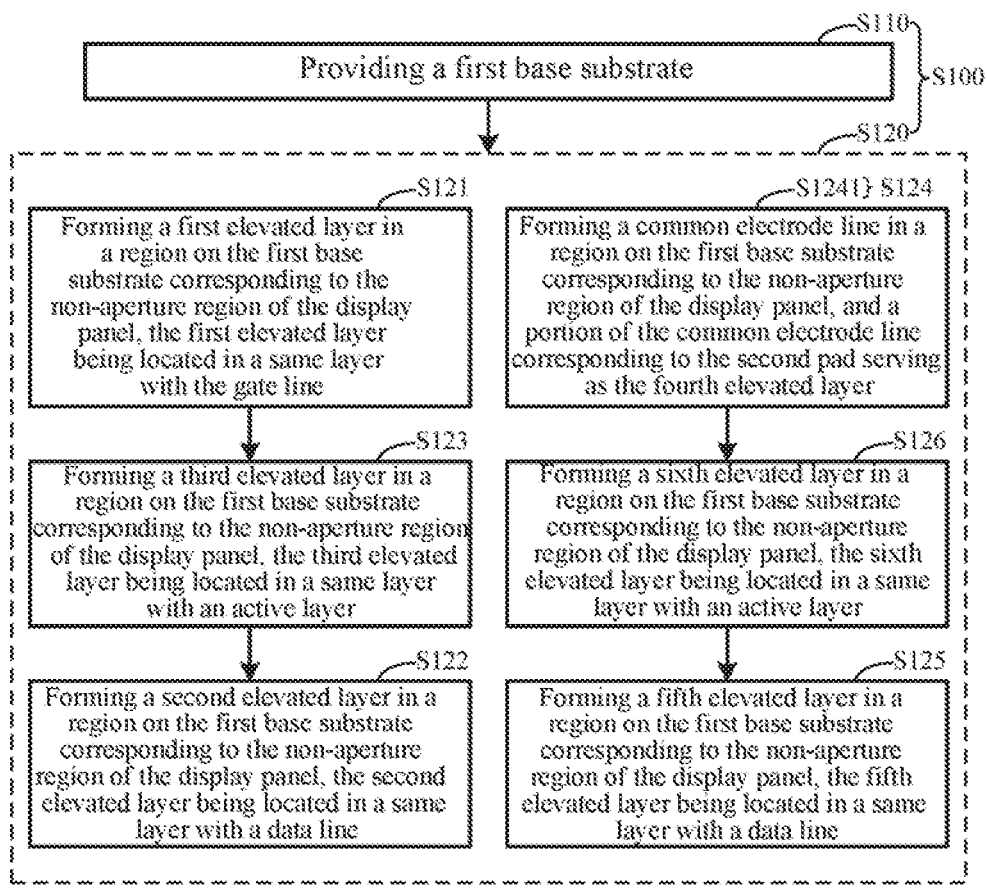
FIG. 10 is a fifth flow chart of a manufacturing method of a display panel provided by an arrangement of the present disclosure.

In the case where the display panel further includes a common electrode line, the common electrode line is located in a same layer with the gate line and is located at one side of the gate line, the second pad may correspond to the common electrode line. In such case, referring to FIG. 10, the block S124 of forming a fourth elevated layer in a region on the first base substrate corresponding to the non-aperture region of the display panel includes the following block.

In block S1241, a common electrode line is formed in a region on the first base substrate corresponding to the non-aperture region of the display panel, and a portion of the common electrode line corresponding to the second pad serving as the fourth elevated layer.

Hereinafter, in order to explain the manufacturing method of the display panel provided by the arrangements of the present disclosure in more details, description will be given with reference to the structure of the display panel illustrated in FIG. 4 and FIG. 5 by way of example. The manufacturing method of the display panel may include: providing a first base substrate.

A metal layer, e.g., an aluminum (Al) layer, is deposited on the first base substrate by using a sputtering method; then a gate electrode, a gate line, a common electrode line and a first elevated layer are formed by a single patterning process, in which the gate electrode is connected to a corresponding gate line. That is, first of all, a photoresist is coated on the metal layer, then the photoresist is exposed by using a mask, then the photoresist upon exposure is developed to expose a to-be-etched portion in the metal layer, then the to-be-etched portion in the metal layer is removed by using an etching process (dry etching or wet etching), and then the remaining photoresist is removed to achieve the formation of the gate electrode, the gate line, the common electrode line and the first elevated layer. The first elevated layer and the common electrode line are disposed at two sides of the gate line, respectively; the second pad corresponds to the common electrode line; and a portion of the common electrode line corresponding to the second pad serves as the fourth elevated layer.

A gate insulating layer is formed by using a Plasma Enhanced Chemical Vapor Deposition (PECVD) method, the gate insulating layer covers the first base substrate, the gate electrode, the gate line, the common electrode line and the first elevated layer, and a material of the gate insulating layer may be silicon nitride or silicon oxide.

An active layer material layer is deposited on the gate insulating layer; and an active layer, a third elevated layer and a sixth elevated layer are formed by a single patterning process, in which the sixth elevated layer corresponds to a portion of the common electrode line corresponding to the second pad. For example, when a material of the active layer is amorphous silicon, an amorphous silicon layer may be deposited on the gate insulating layer by using PECVD method, and the active layer, the third elevated layer and the sixth elevated layer are formed by coating a photoresist, exposing the photoresist, developing the photoresist, etching the photoresist and removing the remaining photoresist; or, when the material of the active layer is a metal oxide semiconductor material such as IGZO, a metal oxide semiconductor material layer may be deposited on the gate insulating layer by using a sputtering method, and then the active layer, the third elevated layer and the sixth elevated layer are formed by coating a photoresist, exposing the photoresist, developing the photoresist, etching the photoresist and removing the remaining photoresist.

A metal layer, e.g., Al layer, is deposited on the first base substrate by using a sputtering method; then a source electrode, a drain electrode, a data line, a second elevated layer and a fifth elevated layer are formed by a single patterning process, in which the source electrode and the drain electrode are in contact with the active layer, respectively, the source electrode is connected to a corresponding data line, the second elevated layer is located on the third elevated layer, and the fifth elevated layer is located on the sixth elevated layer. That is, the source electrode, the drain electrode, the data line, the second elevated layer and the fifth elevated layer are formed by coating a photoresist, exposing the photoresist, developing the photoresist, etching the photoresist and removing the remaining photoresist.

A passivation layer is formed by using a PECVD method; the passivation layer covers the gate insulating layer, the active layer, the source electrode, the drain electrode, the data line, the second elevated layer and the fifth elevated layer; and a via hole is formed at a position in the passivation layer corresponding to the drain electrode by coating a photoresist, exposing the photoresist, developing the photoresist, etching the photoresist and removing the remaining photoresist. A material of the passivation layer may be silicon nitride or silicon oxide.

A transparent metal oxide conductive material layer, e.g., an indium tin oxide (ITO) material layer is deposited on the passivation layer by using a sputtering method; a pixel electrode is formed by coating a photoresist, exposing the photoresist, developing the photoresist, etching the photoresist and removing the remaining photoresist; and the pixel electrode is connected to the drain electrode through the via hole in the passivation layer.

Particular features, structures, materials or characteristics in the description of the arrangements above may be combined in any one or more arrangements or examples in an appropriate way.

The above are only exemplary implementations of the present disclosure, without limiting the protection scope of the present disclosure thereto. Any changes or substitutions easily occur to those skilled in the art within the technical scope of the present disclosure should be covered in the protection scope of the present disclosure. Therefore, the protection scope of the present disclosure should be based on the protection scope of the claims.

What is claimed is:

1. A display panel, comprising:
an array substrate comprising a plurality of pixel regions defined by a plurality of gate lines intersected with a plurality of data lines, wherein each of the pixel regions comprises:
an aperture region, a non-aperture region surrounding the aperture region, and a spacer disposed in the non-aperture region; and
a padding structure provided in the non-aperture region, the padding structure comprising a first pad and a second pad located in the non-aperture region, the first pad and the second pad being located at two sides of the spacer, respectively, and the first pad and the second pad being located at two sides of a corresponding one of the plurality of gate lines, respectively, and the padding structure being configured to prevent the spacer from moving into the aperture region;
a first base substrate and a gate line located in a region on the first base substrate corresponding to the non-aperture region, wherein the spacer is located in an area of the non-aperture region corresponding to the gate line, and the padding structure is located on the first base substrate;
wherein a total thickness of a film layer structure in a region on the first base substrate corresponding to the first pad is greater than a total thickness of a film layer structure in a region on the first base substrate corresponding to the gate line, and a total thickness of a film layer structure in a region on the first base substrate corresponding to the second pad is greater than the total thickness of the film layer structure in the region on the first base substrate corresponding to the gate line;
wherein the first pad comprises: a first elevated layer located in a same layer with the gate line, the first elevated layer and the gate line being spaced apart, a second elevated layer located in a same layer with a data line, and a third elevated layer located in a same layer with an active layer, the third elevated layer and the active layer being spaced apart;
wherein the second pad comprises: a fourth elevated layer located in a same layer with the gate line, a fifth elevated layer located in a same layer with the data line, and a sixth elevated layer located in a same layer with the active layer; and
a common electrode line located in a same layer with the gate line and being located at one side of the gate line, wherein:
the first pad corresponds to the common electrode line, and a portion of the common electrode line corresponding to the first pad serves as the first elevated layer; or,
the second pad corresponds to the common electrode line, and a portion of the common electrode line corresponding to the second pad serves as the fourth elevated layer.

2. A method for manufacturing a display panel, comprising:
providing an array substrate comprising a plurality of pixel regions defined by a plurality of gate lines intersected with a plurality of data lines, wherein each of the pixel regions comprises an aperture region, a non-aperture region surrounding the aperture region, and a spacer disposed in the non-aperture region; and
forming a padding structure in the non-aperture region in each of the plurality of pixel regions of the display panel, the padding structure comprising a first pad and a second pad located in the non-aperture region, the first pad and the second pad being located at two sides of the spacer, respectively, and the first pad and the second pad being located at two sides of the corresponding gate line, respectively, and the padding structure being configured to prevent the spacer from moving into the aperture region, the spacer being located in an area of the non-aperture region corresponding to the gate line, the padding structure comprising the first pad and the second pad, wherein forming the padding structure in the non-aperture region of the display panel comprises:
providing a first base substrate; and
forming the first pad and the second pad in a region on the first base substrate corresponding to the non-aperture region of the display panel,
wherein a total thickness of a film layer structure in a region on the first base substrate corresponding to the first pad is greater than a total thickness of a film layer structure in a region on the first base substrate corresponding to the gate line, and a total thickness of a film layer structure in a region on the first base substrate corresponding to the second pad is greater than the total thickness of the film layer structure in the region on the first base substrate corresponding to the gate line;
wherein the first pad comprises a first elevated layer, a second elevated layer, and a third elevated layer, and forming the first pad in a region on the first base substrate corresponding to the non-aperture region of the display panel comprises:

forming the first elevated layer in a region on the first base substrate corresponding to the non-aperture region of the display panel, the first elevated layer being located in a same layer with the gate line, and the first elevated layer and the gate line being spaced apart;

forming the second elevated layer in a region on the first base substrate corresponding to the non-aperture region of the display panel, the second elevated layer being located in a same layer with a data line; and forming the third elevated layer in a region on the first base substrate corresponding to the non-aperture region of the display panel, the third elevated layer being located in a same layer with an active layer, and the third elevated layer and the active layer being spaced apart;

wherein the second pad comprises a fourth elevated layer, a fifth elevated layer and a sixth elevated layer, and forming the second pad in a region on the first base substrate corresponding to the non-aperture region of the display panel comprises:

forming the fourth elevated layer in a region on the first base substrate corresponding to the non-aperture region of the display panel, the fourth elevated layer being located in a same layer with the gate line;

forming the fifth elevated layer in a region on the first base substrate corresponding to the non-aperture region of the display panel, the fifth elevated layer being located in a same layer with a data line; and forming the sixth elevated layer in a region on the first base substrate corresponding to the non-aperture region of the display panel, the sixth elevated layer being located in a same layer with an active layer;

wherein the display panel comprises a common electrode line located in a same layer with the gate line and being located at one side of the gate line; and wherein the first pad corresponds to the common electrode line, and forming the first elevated layer in a region on the first base substrate corresponding to the non-aperture region of the display panel comprises: forming the common electrode line in the region on the first base substrate corresponding to the non-aperture region of the display panel, and a portion of the common electrode line corresponding to the first pad serving as the first elevated layer; or, wherein the second pad corresponds to the common electrode line, and forming the fourth elevated layer in a region on the first base substrate corresponding to the non-aperture region of the display panel comprises: forming the common electrode line in the region on the first base substrate corresponding to the non-aperture region of the display panel, and a portion of the common electrode line corresponding to the second pad serving as the fourth elevated layer.

3. The method according to claim 2, wherein the first elevated layer is formed along with the gate line by a single patterning process; the second elevated layer is formed along with the data line by a single patterning process; and the third elevated layer is formed along with the active layer by a single patterning process.

4. The method according to claim 3, wherein the second elevated layer is formed along with the third elevated layer by a single patterning process.

5. The method according to claim 2, wherein the fourth elevated layer is formed along with the gate line by a single patterning process; the fifth elevated layer is formed along with the data line by a single patterning process; and the sixth elevated layer is formed along with the active layer by a single patterning process.

6. The method according to claim 5, wherein the fifth elevated layer is formed along with the sixth elevated layer by a single patterning process.

7. The display panel according to claim 1, wherein the display panel is part of a display device.

8. An array substrate, comprising:
a plurality of pixel regions defined by a plurality of gate lines intersected with a plurality of data lines, wherein each of the pixel regions comprises:
an aperture region, a non-aperture region surrounding the aperture region, and a spacer disposed in the non-aperture region; and
a padding structure provided in the non-aperture region, the padding structure comprising a first pad and a second pad located in the non-aperture region, the first pad and the second pad being located at two sides of the spacer, respectively, and the first pad and the second pad being located at two sides of a corresponding one of the plurality of gate lines, respectively, and the padding structure being configured to prevent the spacer from moving into the aperture region;
a first base substrate and a gate line located in a region on the first base substrate corresponding to the non-aperture region, wherein the spacer is located in an area of the non-aperture region corresponding to the gate line, and the padding structure is located on the first base substrate;
wherein a total thickness of a film layer structure in a region on the first base substrate corresponding to the first pad is greater than a total thickness of a film layer structure in a region on the first base substrate corresponding to the gate line, and a total thickness of a film layer structure in a region on the first base substrate corresponding to the second pad is greater than the total thickness of the film layer structure in the region on the first base substrate corresponding to the gate line; and
wherein the first pad comprises: a first elevated layer located in a same layer with the gate line, and the first elevated layer and the gate line are spaced apart, a second elevated layer located in a same layer with a data line, and a third elevated layer located in a same layer with an active layer, the third elevated layer and the active layer are spaced apart;
wherein the second pad comprises: a fourth elevated layer located in a same layer with the gate line, a fifth elevated layer located in a same layer with the data line, and a sixth elevated layer located in a same layer with the active layer; and
a common electrode line located in a same layer with the gate line and being located at one side of the gate line, wherein:
the first pad corresponds to the common electrode line, and a portion of the common electrode line corresponding to the first pad serves as the first elevated layer; or,
the second pad corresponds to the common electrode line, and a portion of the common electrode line corresponding to the second pad serves as the fourth elevated layer.

9. An array substrate manufacturing method, for manufacturing the array substrate according to claim 8, comprising:

forming a padding structure in a non-aperture region of each of the plurality of pixel regions of the array substrate, the padding structure comprising a first pad and a second pad located in the non-aperture region, the first pad and the second pad being located at two sides of the spacer, respectively, and the first pad and the second pad being located at two sides of the gate line, respectively, and the padding structure being configured to prevent the spacer from moving into an aperture region.

10. The method according to claim 9, wherein,
the spacer is located in an area of the non-aperture region corresponding to a gate line; the padding structure comprises a first pad and a second pad; and forming a padding structure in a non-aperture region of the display panel comprises:
providing a first base substrate; and
forming the first pad and the second pad in a region on the first base substrate corresponding to the non-aperture region of the display panel,
wherein, a total thickness of a film layer structure in a region on the first base substrate corresponding to the first pad is greater than a total thickness of a film layer structure in a region on the first base substrate corresponding to the gate line; and a total thickness of a film layer structure in a region on the first base substrate corresponding to the second pad is greater than the total thickness of the film layer structure in the region on the first base substrate corresponding to the gate line.

\* \* \* \* \*